United States Patent
Lakhani

(10) Patent No.: US 6,567,302 B2
(45) Date of Patent: May 20, 2003

(54) METHOD AND APPARATUS FOR PROGRAMMING MULTI-STATE CELLS IN A MEMORY DEVICE

(75) Inventor: Vinod Lakhani, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/884,628

(22) Filed: Jun. 19, 2001

(65) Prior Publication Data

US 2001/0040826 A1 Nov. 15, 2001

Related U.S. Application Data

(63) Continuation of application No. 09/223,087, filed on Dec. 29, 1998, now abandoned.

(51) Int. Cl.[7] .................................................. G11C 16/04
(52) U.S. Cl. ......................... 365/185.03; 365/185.19; 365/185.22; 365/185.24; 365/185.33
(58) Field of Search ....................... 365/185.03, 185.33, 365/185.19, 184, 185.22, 185.24, 185.29

(56) References Cited

U.S. PATENT DOCUMENTS

| | | | |
|---|---|---|---|
| 4,653,023 A | 3/1987 | Suzuki et al. ................ 365/104 |
| 5,043,940 A | 8/1991 | Harari ........................ 365/168 |
| 5,142,496 A | 8/1992 | Van Buskirk ............... 365/201 |
| 5,153,880 A | 10/1992 | Owen et al. ................ 371/10.2 |
| 5,218,570 A | 6/1993 | Pascucci et al. ........ 365/189.01 |
| 5,293,560 A | 3/1994 | Harari ........................ 365/185 |
| 5,321,655 A | 6/1994 | Iwahashi et al. ............ 365/200 |
| 5,321,699 A | 6/1994 | Endoh et al. ................ 371/21.5 |
| 5,339,272 A | 8/1994 | Tedrow et al. ......... 365/189.09 |
| 5,386,388 A | 1/1995 | Atwood et al. .............. 365/201 |
| 5,394,362 A | 2/1995 | Banks ..................... 365/189.01 |
| 5,420,822 A | 5/1995 | Kato et al. .................. 365/218 |
| 5,434,825 A | 7/1995 | Harari ........................ 365/185 |
| 5,469,444 A | 11/1995 | Endoh et al. ................ 371/215 |

(List continued on next page.)

OTHER PUBLICATIONS

Chevallier, C., "System for Performing Analog Over–Program and Under–Program Detection for a Multistate Memory Cell", U.S. Application –S/N 09/652802 –Filed Aug. 31, 2000,.

Norman, R., et al. ,"Apparatus and Method for Detecting Over–Programming Condition in Multistate Memory Device", U.S. Application –S/N 09/641693 –Filed Aug. 18, 2000.

Primary Examiner—Richard Elms
Assistant Examiner—Van Thu Nguyen
(74) Attorney, Agent, or Firm—Schwegman, Lundberg, Woessner & Kluth, P.A.

(57) ABSTRACT

A method for programming multi-state floating gate transistor memory cells, also called multi-state flash cells, in a memory system is disclosed. The memory system includes control circuitry for controlling an array of multi-state flash cells which are arranged in blocks and connected together in rows and columns. The method is implemented as a series of programmable instructions stored and implemented in the memory system. According to the method groups of multi-state flash cells are incrementaly programmed. In each programming step the threshold voltage levels of the cells being programmed is raised only one state. Successive subgroups of cells are programmed to increase their threshold voltage levels in a step-by-step manner. The multi-state flash cells are programmed to store the desired data over several steps. Cells that are under-programmed in any step are reprogrammed before the method continues. Margins between the threshold voltage levels in the cells are maintained by a verification of the programmed cells. Over-programmed multi-state flash cells are identified and discarded at each programming step by calculating and retaining overshoot data.

30 Claims, 7 Drawing Sheets

U.S. PATENT DOCUMENTS

| | | | |
|---|---|---|---|
| 5,495,442 A | 2/1996 | Cernea et al. | 365/185.03 |
| 5,523,972 A | 6/1996 | Rashid et al. | 365/185.22 |
| 5,539,690 A | 7/1996 | Talreja et al. | 365/185.22 |
| 5,555,204 A | 9/1996 | Endoh et al. | 365/218 |
| 5,566,125 A | 10/1996 | Fazio et al. | 365/45 |
| 5,570,315 A | 10/1996 | Tanaka et al. | 365/185.22 |
| 5,583,812 A | 12/1996 | Harari | 365/185.33 |
| 5,602,789 A | 2/1997 | Endoh et al. | 365/201 |
| 5,608,669 A | 3/1997 | Mi et al. | 365/185.19 |
| 5,608,676 A | 3/1997 | Medlock et al. | 365/189.09 |
| 5,621,686 A | 4/1997 | Alexis | 365/185.21 |
| 5,627,784 A | 5/1997 | Roohparvar | 365/189.01 |
| 5,638,320 A | 6/1997 | Wong et al. | 365/185.03 |
| 5,638,326 A | 6/1997 | Hollmer et al. | 365/185.2 |
| 5,642,312 A | 6/1997 | Harari | 365/185.33 |
| 5,648,934 A | 7/1997 | O'Toole | 365/200 |
| 5,654,918 A | 8/1997 | Hammick | 365/185.2 |
| 5,673,224 A | 9/1997 | Chevallier et al. | 365/185.23 |
| 5,684,739 A | 11/1997 | Takeuchi | 365/185.03 |
| 5,694,366 A | 12/1997 | Chevallier et al. | 365/207 |
| 5,729,489 A | 3/1998 | Fazio et al. | 365/185.03 |
| 5,737,260 A | 4/1998 | Takata et al. | 365/145 |
| 5,764,568 A | 6/1998 | Chevallier | 365/185.03 |
| 5,764,571 A | 6/1998 | Banks | 365/189.01 |
| 5,768,184 A | 6/1998 | Hayashi et al. | 365/185.03 |
| 5,768,191 A | 6/1998 | Choi et al. | 365/185.03 |
| 5,768,287 A | 6/1998 | Norman et al. | 371/21.2 |
| 5,771,346 A | 6/1998 | Norman et al. | 395/183.18 |
| 5,790,453 A | 8/1998 | Chevallier et al. | 365/185.03 |
| 5,903,504 A | 5/1999 | Chevallier et al. | 365/207 |
| 5,909,390 A | 6/1999 | Harari | 365/185.03 |
| 5,912,838 A | 6/1999 | Chevallier | 365/185.03 |
| 5,943,260 A | 8/1999 | Hirakawa | 365/185.03 |
| 5,978,289 A | 11/1999 | Merritt | 365/200 |
| 6,049,899 A * | 4/2000 | Auclair et al. | 365/184 |
| 6,075,738 A | 6/2000 | Takano | 365/210 |
| 6,078,518 A | 6/2000 | Chevallier | 365/185.03 |
| 6,112,314 A | 8/2000 | Norman et al. | 714/37 |
| 6,163,479 A | 12/2000 | Chevallier | 365/185.03 |
| 6,175,937 B1 | 1/2001 | Norman et al. | 714/718 |
| 6,278,632 B1 | 8/2001 | Chevallier | 365/185.03 |
| 6,324,094 B1 | 11/2001 | Chevallier | 365/185.03 |

* cited by examiner

METHOD AND APPARATUS FOR PROGRAMMING MULTI-STATE CELLS IN A MEMORY DEVICE

This application is Continuation of U.S. Ser. No. 09/223,087 filed Dec. 29, 1998 now abandoned.

FIELD OF THE INVENTION

The present invention relates to memory devices, and more particularly, to a method and apparatus for programming a memory device having multi-state cells.

BACKGROUND

Electrically erasable and programmable memory devices having arrays of what are known as multi-bit or multi-state flash cells are found in a wide variety of electrical devices. A flash cell, also called a floating gate transistor memory cell, is similar to a field effect transistor, having a channel region between a source and a drain and a control gate over the channel region. In addition the flash cell has a floating gate between the control gate and the channel region. The floating gate is separated from the channel region by a layer of gate oxide, and an interpoly dielectric layer separates the control gate from the floating gate. Both the control gate and the floating gate are formed of doped polysilicon. The floating gate remains floating or electrically isolated. A flash cell is programmed by applying appropriate voltages to the control gate, the drain, and the source, causing electrons to pass from the channel region to the floating gate through the gate oxide. The voltage applied to the control gate, called a programming voltage, determines the amount of charge residing on the floating gate after programming, and the charge determines the voltage that must be applied to the control gate in order to allow the flash cell to conduct current between the source and the drain. This voltage is termed the threshold voltage of the flash cell, and is the physical form of the data stored in the flash cell. As charge is added to the floating gate the threshold voltage of the flash cell increases.

A multi-bit or multi-state flash cell is produced by creating multiple, distinct threshold voltage levels over a voltage range within the flash cell. Each distinct threshold voltage level corresponds to a set of data bits, with the number of bits representing the amount of data which can be stored in the multi-state flash cell. This method allows multiple bits of binary data to be stored within the same flash cell. When reading the state of the flash cell, the threshold voltage level for which the flash cell conducts current corresponds to a bit set representing data programmed into the flash cell.

A multi-state flash cell is programmed by applying a programming voltage to the control gate and holding the drain to a constant voltage over a proper time period to store enough charge in the floating gate to move the threshold voltage of the flash cell to a desired level. This threshold voltage level represents a state of the flash cell corresponding to the data stored in the flash cell. For example, a flash cell that is capable of storing four threshold voltage levels may contain two data bits, each bit having a value of "0" or "1."

When a multi-state flash cell is programmed the programming voltage must be precise to ensure that the multi-state flash cell is accurately programmed. Multi-state flash cells are often over-programmed, or programmed with an excessive programming voltage. Accordingly, there exists a need to adequately program multi-state flash cells in memory devices and to appropriately manage over-programmed multi-state flash cells.

SUMMARY OF THE INVENTION

The above mentioned deficiencies in the conventional method of programming cells in a memory device are addressed in the following detailed description of the preferred embodiments of the invention. According to one embodiment of the invention a group of multi-state memory cells in a memory device are programmed to a first state, and then cells in a first subset of the group are programmed to a second state different from the first state.

Advantages of the invention will be apparent to one skilled in the art upon an examination of the detailed description of the preferred embodiments.

DETAILED DESCRIPTION OF THE PREFERRED EMBODIMENTS

In the following detailed description, reference is made to the accompanying drawings which form a part hereof, and in which are shown, by way of illustration, specific embodiments in which the invention may be practiced. The embodiments are described in sufficient detail to enable those skilled in the art to practice the invention. Other embodiments may be used and changes may be made without departing from the scope of the present invention. The following detailed description is, therefore, not to be taken in a limiting sense, and the scope of the present invention is defined only by the appended claims and their equivalents.

Figure 1:
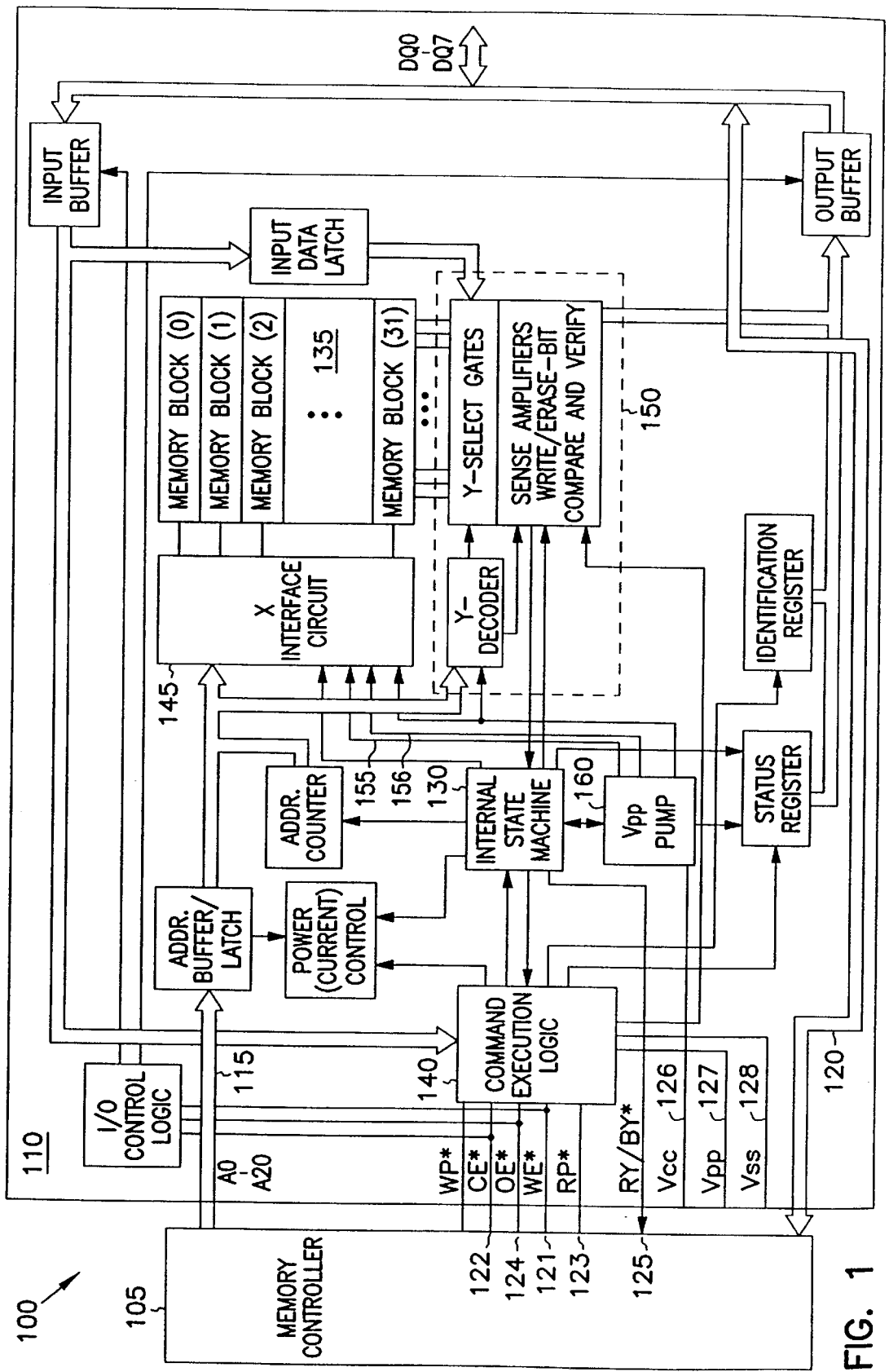
FIG. 1 is a schematic diagram of a memory system according to an embodiment of the present invention.

FIG. 1 is a schematic diagram illustrating, by way of example, but not by way of limitation, one embodiment of a memory system 100 including features of the present invention. The memory system 100 includes a memory controller 105 and a memory integrated circuit (IC) 110. The controller 105 includes a control device such as a microprocessor to provide interface signals to the IC 110. The interface signals include address signals provided over multiple address lines 115, and data signals communicated over multiple data lines 120. Other interface signals provided by the controller 105 include a write enable signal WE* at node 121, a chip enable signal CE* at node 122, a reset/power-down signal RP* at node 123, and an output enable signal OE* at node 124, all of which are active low signals. The IC 110 provides a status signal RY/BY* to the controller 105 at node 125 to indicate the status of an internal state machine 130. The IC 110 also receives a positive power supply voltage $V_{CC}$ at node 126, a write/erase supply (or programming) voltage $V_{PP}$ at node 127, and a reference voltage such as a substrate ground voltage $V_{SS}$ at node 128 which is approximately 0 Volts.

The IC 110 includes an array 135 of floating gate transistor memory cells arranged in 32 memory cell blocks. Each block in the array 135 contains 64 kilobytes of floating gate transistor memory cells. Data stored in each block is erased independently without disturbing data stored in other blocks. A command execution logic module 140 receives the above-described interface signals from the controller 105. The module 140 controls the state machine 130 which provides write and block erase timing sequences to the array 135 through an X-interface circuit 145 and a Y-interface circuit 150.

The Y-interface circuit 150 provides access to individual memory cells through data lines in the array 135. Data lines in the Y-interface circuit 150 are connected to a bit line driver circuit (not shown). The Y-interface circuit 150 includes a Y-decoder circuit, Y-select gates, sense-amplifiers, and write/erase bit compare and verify circuits. The X-interface circuit 145 provides access to rows of memory cells through word lines in the array 135, which are electrically coupled to control gates of the cells in the array 135. The X-interface circuit 145 includes decoding and control circuits for erasing individual blocks of the cells in the array 135.

Each floating gate transistor memory cell in the array 135 is a multi-state flash cell capable of holding four separate and distinct threshold voltage levels, and is therefore capable of storing data represented by two data bits. More specifically, the multi-state flash cell may be programmed to store the data "00," "01," "10," or "11."

Figure 2:
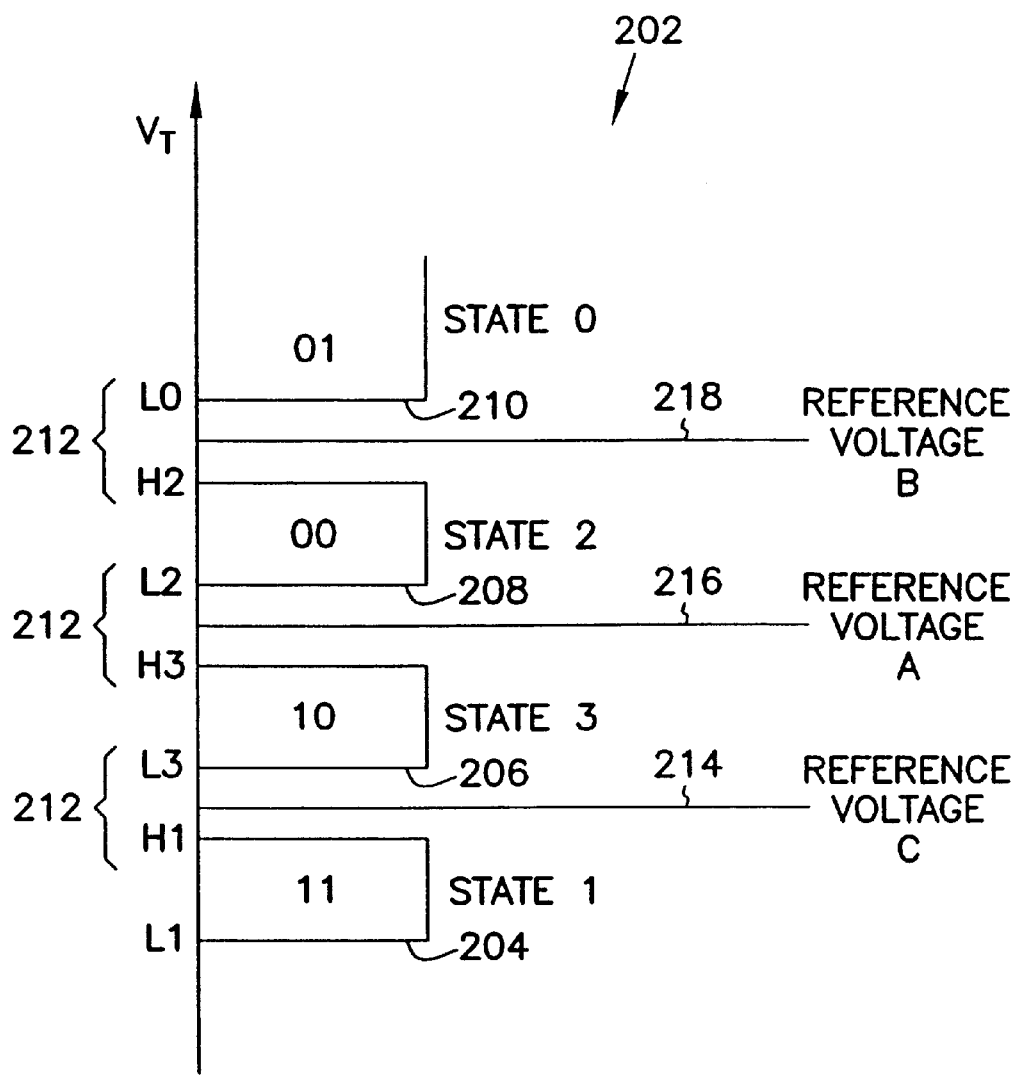
FIG. 2 is a plot of threshold voltage levels of a floating gate transistor memory cell according to the embodiment of the present invention.

FIG. 2 is a plot 202 of threshold voltage levels that may be programmed in the multi-state flash cells according to the embodiment of the invention. A rising threshold voltage $V_T$ is shown on a vertical axis. Four bands of voltage 204, 206, 208, 210 within a voltage range are shown, and a distinct threshold voltage level may be detected in each band. Each band 204, 206, 208, 210 is separated from neighboring bands by a voltage margin 212, described below. The bands 204, 206, 208, 210 are respectively labeled as state 1, state 3, state 2, and state 0 to identify the state of the cell. Each of the states 1, 3, 2, 0 is defined between two voltage levels. State 1 is defined between the voltage L1 (the lower voltage threshold of the state) and the voltage H1 (the higher voltage threshold of the state). State 3 is defined between L3 and H3, state 2 is defined between L2 and H2, and state 0 is defined to be voltages greater than or equal to L0. Each of the states 1, 3, 2, and 0 represents two data bits. For example, a cell programmed to state 1 holds data representing the bits 11. State 3 represents the bits 10, state 2 represents the bits 00, and state 0 represents the bits 01. Thus, the array 135 is able to store two data bits per cell. The arrangement of the bits is chosen so that adjacent states differ by only one bit. This arrangement minimizes the impact of errors in reading the data stored in a cell. Although this embodiment is described as having cells programmable in only four states, the present invention contemplates the employment of cells programmable in more than four states where each state represents more than two data bits. For example, cells programmable at one of 256 or more voltage levels are contemplated, and are within the scope of the present invention.

Data that is stored as an electronic signal in a cell is prone to corruption from disturb conditions and charge loss, both of which affect the integrity of the signal. Accordingly, the margins, indicated at 212, are maintained between the bands 204, 206, 208, 210. Reference voltages are selected to facilitate a reading of the cell along the voltage range shown in FIG. 2. Three reference voltages C, A, and B, respectively denoted by the numerals 214, 216, 218, have been selected within the margins 212. Reference voltage C is between the states 1 and 3, reference voltage A is between the states 3 and 2, and reference voltage B is between the states 2 and 0. The reference voltages C, A, and B may be selected or changed by a series of appropriate programmable instructions stored and implemented in the memory system 100.

Data stored in the array 135 is retrieved by selecting one or more cells and reading the contents of the cells. As a cell is selected, its source is coupled to a ground voltage and its drain is coupled to a low positive voltage, for example +1.5 volts. The reference voltages C, A, and B are then applied to the control gate of the selected cell in a sequence. A sense amplifier generates binary output data to indicate whether the selected cell is activated to conduct current for each reference voltage. The sense amplifier will generate a "1" if the applied reference voltage is higher than the programmed threshold voltage level and the selected cell is activated to conduct current. The sense amplifier will generate a "0" if the applied reference voltage is lower than the programmed threshold voltage level and the selected cell is not activated and does not conduct current. For example, if the selected cell is programmed with a threshold voltage level corresponding to the bits 10, the threshold voltage level falls within state 3. State 3 is higher than reference voltage C but lower than reference voltages A and B. Accordingly, the sense amplifier output is 1, 1, and 0 for the reference voltages A, B, and C, respectively.

Table 1, shown below, is a multi-state read logic table according to the embodiment of the invention shown in FIGS. 1 and 2. Shown in Table 1 are all of the potential combinations of binary output data generated by the sense amplifier for each of the reference voltages A, B, and C that may be applied to the control gate of a selected cell. Also shown in Table 1 are the combinations of data bits, identified as Data D, corresponding to each combination of output data of the sense amplifier, and the associated cell threshold voltage level $V_T$.

TABLE 1

| Sense Amplifier Output Data | | | | |
| --- | --- | --- | --- | --- |
| A | B | C | Data D | Cell $V_\tau$ |
| 0 | 0 | 0 | 01 | high |
| 0 | 1 | 0 | 00 | inter-high |
| 1 | 1 | 0 | 10 | inter-low |
| 1 | 1 | 1 | 11 | low |

Figure 3:
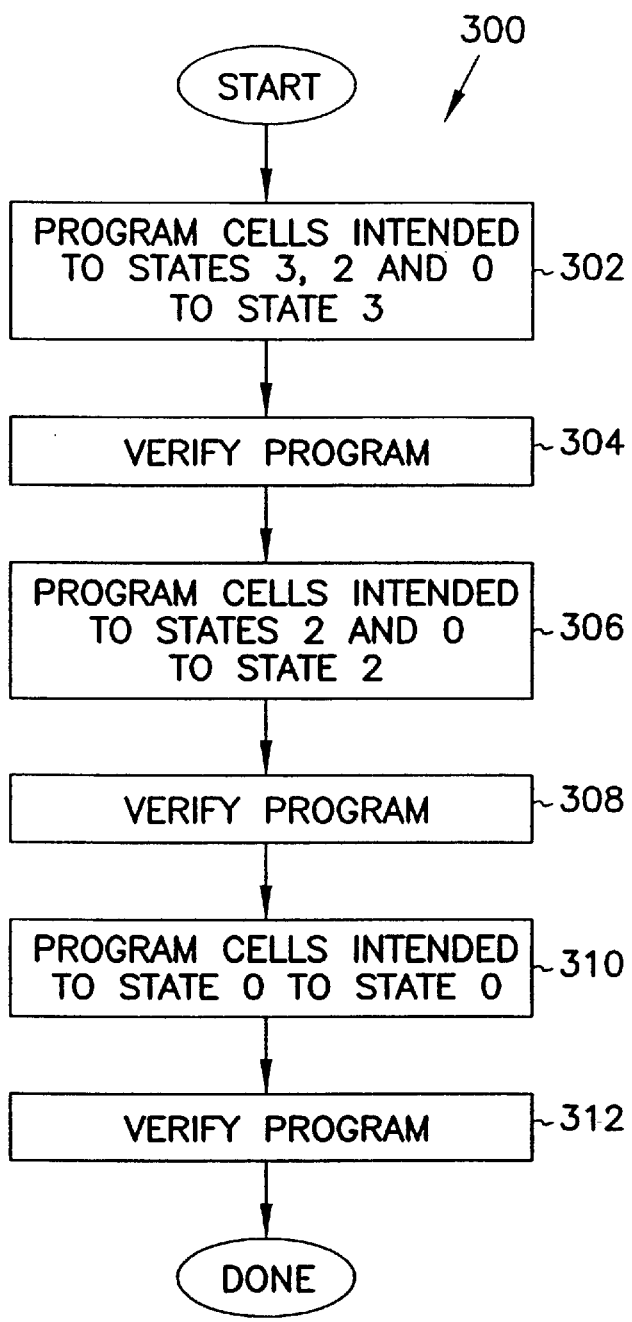
FIG. 3 is a flow chart of a method for programming floating gate transistor memory cells according to the embodiment of the present invention.

FIG. 3 is a flow chart of a method 300 executable by the memory system 100 according to the embodiment of the invention. The method 300 is preferably implemented as a series of programmable instructions stored and implemented in the memory system 100. By way of a non-limiting example the method 300 will be applied to program cells in a block of the multi-state flash cells in the array 135. The cells will be described as being erased or programmed to one of the states 1, 3, 2, and 0, which means, more specifically, that the cells are erased or programmed to have a threshold voltage level within one of the states 1, 3, 2, and 0, respectively, and that the cells store data corresponding to their programmed threshold voltages. According to the method 300 all of the cells in the block are assumed to be initially erased to state 1, and therefore all of the cells initially store the data "11." The method 300 will be described according to a scenario in which three groups of cells in the block are programmed to one of the states 0, 2, and 3, respectively. The remaining cells in the block that are not programmed retain the data "11."

Each cell is programmed in the following manner. The source of the cell is coupled to a ground voltage and the drain of the cell is coupled to a positive voltage, for example +6 volts. The control gate of the cell is then coupled to a programming voltage suitable to program the cell to the appropriate state. The programming voltage is applied as a voltage pulse which is long enough to ensure that the cell is programmed to the correct state. As discussed above, some cells may be over-programmed by an excessive programming voltage.

The term pulse is used in a broad sense in this description, referring to the application of a selected voltage level to a terminal for a finite time period. Those skilled in the art will understand that a single pulse such as an erase pulse may be applied continuously for the finite time period, or may be comprised of a series of shorter discrete pulses applied in sequence and having a summed or total time period equal to the finite time period.

According to the method 300 the three groups of cells are initially programmed to state 3 in step 302. The cells are not programmed to state 1 because, as described above, all of the cells in the block have been erased to state 1. Once the programming of the cells to state 3 is completed, the cells are verified as being appropriately programmed in step 304. The cells are verified by reading each programmed cell, as described above, and verifying that the output data generated by the sense amplifier is equivalent to the data programmed into the cell. Thereafter, the two groups of cells to be finally programmed to states 0 and 2 are programmed to state 2 in step 306, and this programming is verified in step 308. The group of cells to be finally programmed to state 0 is then programmed to state 0 in step 310 and the programming of that group of cells is verified in step 312.

The verification performed in steps 304, 308 and 312 determines whether the programmed cells have a threshold voltage level within the limits of the appropriate state as shown in FIG. 2. If during verification a cell is found to be programmed to a state higher than that desired, or over-programmed (called "overshoot"), the cell is identified and ignored in further programming and reading operations and another, extra cell is selected and programmed in its place. The over-programmed cell is left dormant to be recovered in an erase operation. A cell that was programmed to a threshold voltage level below the desired state is "under-programmed" (called "undershoot"). In an alternative embodiment of the invention, if the cell fails to reach the desired state, the cell is reprogrammed and then verified again. In another embodiment of the invention, the under-programmed cell is ignored and another cell is programmed to the desired state.

Those skilled in the art will understand that, in another embodiment of the invention, if the cells in the block are not initially erased the method 300 can be modified to include steps to program the cells in the block to state 1.

Figure 4A:
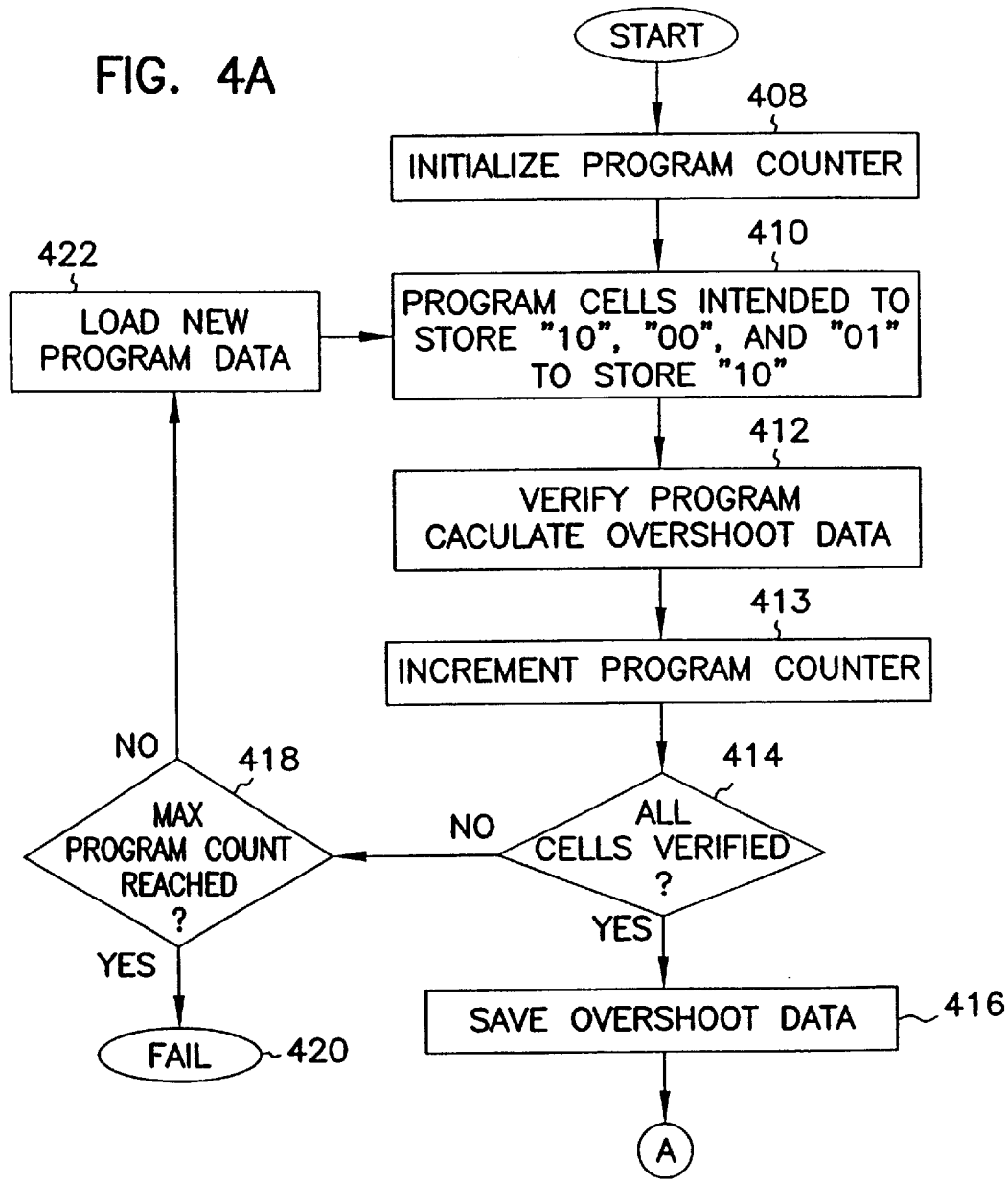
FIGS. 4A and 4B are a flow chart of a method for programming floating gate transistor memory cells according to another embodiment of the present invention.
Figure 4B:
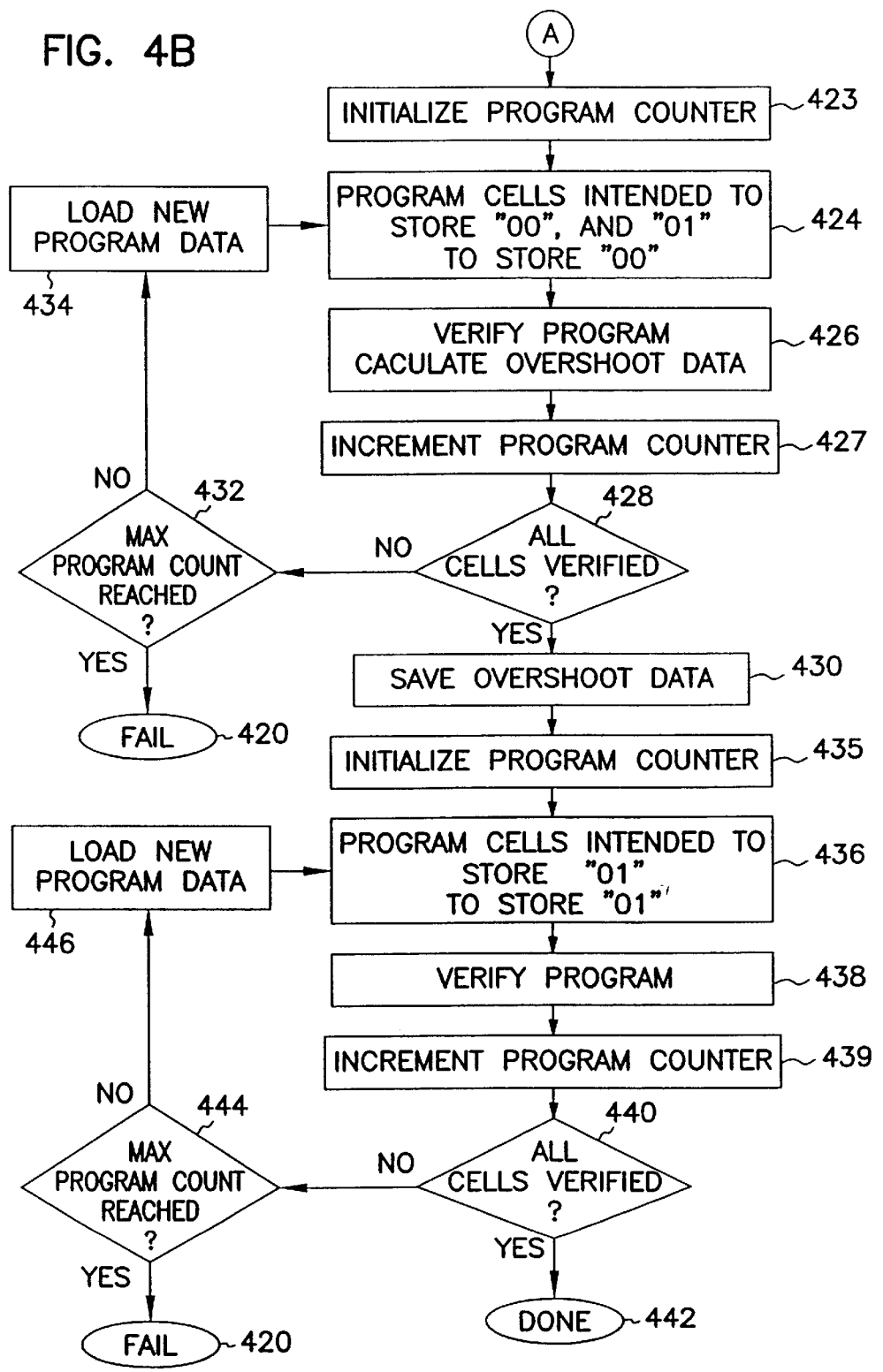

FIGS. 4A and 4B combined are a flow chart of a more detailed method 400 in accordance with another embodiment of the present invention. The method 400 is preferably implemented as a series of programmable instructions stored and implemented in the memory system 100. By way of a non-limiting example the method 400 will be applied to program cells in a block of the multi-state flash cells in the array 135. The cells will be described as being erased or programmed to store pairs of data bits represented by data D. Data D comprises an even component D_E representing the most significant bit and an odd component D_O representing the least significant bit of the pair of data bits. For example, for the data "01," the even component D_E is "0" and the V, odd component D_O is "1." All of the cells in the block are assumed to be initially erased to store the data "11." Three groups of cells in the block are to be programmed to store the data "10," "00," and "01," respectively, and the remaining cells will retain the data "11."

The method 400 begins in FIG. 4A when a program counter is initialized in step 408. Next, the cells to be programmed to store the data "10," "00," and "01 ," are all programmed to store "10" in step 410. A programming voltage VG_10 is selected to be applied to rowlines connected to the control gates of the cells to be programmed and a positive voltage VD is coupled to the drains of the cells to be programmed. Cells that are not to be programmed have their drains coupled to ground to prevent them from being programmed. The programming voltage VG_10 is selected so that the data "10" is stored in each programmed cell. The programming is carried out according to a program decision table shown as Table 2.

TABLE 2

| data D | PROG_10 |
|--------|---------|
| 11     | 1       |
| 10     | 0       |
| 00     | 0       |
| 01     | 0       |

The data D to be stored in the cells in each group is shown in the left column of Table 2 and a program data variable PROG_10 is derived for the cells in the right column according to equation (1):

$$PROG\_10 = D\_E \ \& \ D\_O \qquad (1)$$

Where & represents a logical AND operation. The data D to be stored in the cells is thereby collapsed from 2 bits to the single bit of PROG_10 according to equation (1) and the cells are programmed according to PRO_10. If PROG_10 is "0" for a cell then the voltage VD is applied to the drain of the cell and the data "10" is stored in the cell by a pulse of the programming voltage VG_10 applied to the rowline connected to the control gate of the cell. However, if PROG_10 is "1" for a cell then the drain of the cell is coupled to ground to prevent the cell from being programmed by the pulse of the programming voltage VG_10.

The programming is verified in step 412 by reading each of the programmed cells to determine the data that was stored in the cells. The cells are read according to the procedure described above with respect to Table 1. The reference voltages A, B, and C are selected according to the method 400 to ensure that the margins 212, shown in FIG. 2, are maintained throughout the programming. In step 412 the reference voltage C is selected to be L3, shown in FIG. 2, and the reference voltage A is selected to be H3.

The reference voltage B is selected to be between H2 and L0. The reference voltages C and A are selected such that only the programmed cells with a threshold voltage level between L3 and H3 will be identified as being correctly programmed to store the data "10." Cells that were not programmed within these boundaries are either identified and ignored in further programming and reading operations or they are re-programmed. The method 400 thereby preserves the plot 202 of threshold voltage levels shown in FIG. 2 by strictly maintaining the boundaries L3 and H3 within which the data 10 may be validly read.

With the reference voltages C, A, and B selected each programmed cell is then read and read data R is generated. As with the data D, the read data R comprises two bits, an even bit R_E corresponding to the most significant bit and an odd bit R_O corresponding to the least significant bit. If the programming was successful the read data R will be the same as the data D. The read data R is collapsed into a single bit in a temporary variable TMP_10 for each programmed cell according to equation 2:

$$TMP\_10 = R\_E \ \& \ R\_O \quad (2)$$

TMP_10 is then compared with PROG_10 to generate a variable CMP_10 in equation (3):

$$CMP\_10 = TMP\_10 \ XNOR \ PROG\_10 \quad (3)$$

CMP_10 is equal to "1" when TMP_10 is the same as PROG_10 and the cell is correctly programmed. CMP_10 is equal to "0" when TMP_10 is not the same as PROG_10 and the cell is incorrectly programmed.

Overshoot data O_D is also calculated for each cell in step 412 according to equation (4):

$$O\_D = (D\_E \ \& \ !R\_E) + (!D\_E \ \& \ !D\_O \ \& \ !R\_E \ \& \ R\_O) \quad (4)$$

Where ! indicates a logical NOT or complement operation and + indicates a logical OR operation. The results of a calculation of overshoot data O_D for each possible combination of data D and read data R is shown in Table 3.

TABLE 3

| data D | read data R | overshoot data O_D |
|---|---|---|
| 11 | 11 | 0 |
| 11 | 10 | 1* |
| 11 | 00 | 1* |
| 11 | 01 | 1* |
| 10 | 11 | 0 |
| 10 | 10 | 0 |
| 10 | 00 | 1 |
| 10 | 01 | 1 |
| 00 | 11 | 0 |
| 00 | 10 | 0 |
| 00 | 00 | 0 |
| 00 | 01 | 1 |
| 01 | 11 | 0 |
| 01 | 10 | 0 |
| 01 | 00 | 0 |
| 01 | 01 | 0 |

If the overshoot data O_D is a "0" then the cell is not over-programmed and has a threshold voltage level within or below the state corresponding to the data D that was intended to be stored in the cell. If the overshoot data O_D is a "1" then the cell was over-programmed and has a threshold voltage level that is too high.

The overshoot data O_D marked with an "*" indicates that the cell was not properly erased. According to the method 400, all of the cells in the block are initially erased to store the data "11" before being programmed. When a cell is identified as being improperly erased it is ignored and the data to be stored in that cell is stored in another, extra cell provided for that purpose. In an alternative embodiment of the invention the cells in the block are erased again and the programming steps restarted if it is discovered that some of the cells have not been properly erased. According to an another embodiment of the invention the cells are not erased to a state in which they store the data "11," but are erased to a lower state. All of the cells are then initially programmed to store the data "11."

In step 413 the program counter is incremented and in step 414 the programming is evaluated. If the programming was successful and CMP_10 is 1 for all of the programmed cells then the method 400 continues with step 416 in which the overshoot data O_D is saved. If, however, some of the cells were incorrectly programmed the method moves to step 418 where the program counter is evaluated to determine if the cells have been programmed a maximum number of times. If so, the method 400 ends in failure step 420. However, if the program counter has not reached a maximum then a new program data variable PROG_10_N is calculated in step 422 according to equation (5):

$$PROG\_10\_N = CMP\_10 + O\_tm \quad (5)$$

The method 400 then returns to step 410 where cells for which PROG_10_N is 0 have their drains coupled to the voltage VD and are programmed with a programming voltage VG_10 pulse. Cells for which CMP_10 is 1, which are therefore correctly programmed, and cells for which O_D is 1, which are therefore over-programmed, have their drains coupled to ground to prevent them from being programmed again. The method 400 continues with steps 412-414. As described above, the overshoot data O_D is saved in step 416 so that the over-programmed cells are ignored in future operations. In an alternate embodiment of the invention the programming voltage VG_10 is increased each time step 410 is repeated.

The method 400 continues in FIG. 4B where the program counter is initialized in step 423. Next the cells to be programmed to store the data "00" and "01" are programmed to store "00" in step 424. A programming voltage VG_00 is selected and coupled to rowlines so that the data "00" is stored in each cell to be programmed. The voltage VD is coupled to the drains of the cells to be programmed, and drains of cells not to be programmed are coupled to ground. The programming voltage VG_00 is higher than the programming voltage VG_10. The programming is carried out according to a program decision table shown as Table 4.

TABLE 4

| data D | PROG_00 |
|---|---|
| 11 | 1 |
| 10 | 1 |
| 00 | 0 |
| 01 | 0 |

The data D is shown in the left column of Table 4 and a program variable PROG_00 is derived for the cells in the right column according to equation (6):

$$PROG\_00 = D\_E \quad (6)$$

The cells in which the data "11" and "10" is to be retained are not to be programmed in step 424, PROG_00 is "1" for those cells, and the drains of those cells are coupled to ground. PROG_00 is "0" for the rest of the cells, and the voltage VD is coupled to the drains of these cells in step 424 to store the data "00" during a pulse of the programming voltage VG_00.

The programming of the cells in step 424 is verified in step 426 in a manner similar to the verification described with respect to step 412. The reference voltage C is selected to be between H1 and L3, the reference voltage A is selected to be L2, and the reference voltage B is selected to be H2. Each of the programmed cells is read to generate read data R. A temporary variable TMP_00 is derived for each programmed cell according to equation (7):

$$TMP\_00 = R\_E \tag{7}$$

TMP_00 is then compared with PROG_00 to generate a variable CMP_00 in equation (8):

$$CMP\_00 = TMP\_00 \; XNOR \; PROG\_00 \tag{8}$$

CMP_00 is equal to "1" when TMP_00 is the same as PROG_00 and the cell is correctly programmed. CMP_00 is equal to "0" when the cell is incorrectly programmed. Overshoot data O_D is also calculated according to equation (4), shown above, and if the overshoot data O_D is equal to "1," as shown in Table 3, then the cell is over-programmed.

In step 427 the program counter is incremented and in step 428 the programming is evaluated. If CMP_00 is "1" for all of the programmed cells then the method 400 continues with step 430 in which the overshoot data O_D is saved. If some of the cells were incorrectly programmed the program counter is evaluated in step 432. If the cells have been programmed a maximum number of times the method 400 ends in the failure step 420. If the program counter has not reached a maximum then a new program data variable PROG_00_N is calculated in step 434 according to equation (9):

$$PROG\_00\_N = CMP\_00 + O\_D \tag{9}$$

The method 400 then returns to step 424 where cells for which the new program data variable PROG_00_N is 0 are programmed with a pulse of the programming voltage VG_00. The method 400 continues with steps 426–428. As described above, the overshoot data O_D is saved in step 430. In an alternate embodiment of the invention the programming voltage VG_00 is increased each time step 424 is repeated.

The method 400 continues in step 435 where the program counter is initialized. Next the cells to be programmed to store the data "01" are programmed in step 436. A programming voltage VG_01 is selected and applied to rowlines so that the data "01" is stored in cells to be programmed. The voltage VD is coupled to the drains of the cells to be programmed, and drains of cells not to be programmed are coupled to ground. The programming voltage VG_01 is higher than the programming voltage VG_00. The programming is carried out according to a program decision table shown as Table 5.

TABLE 5

| data D | PROG_01 |
|---|---|
| 11 | 1 |
| 10 | 1 |
| 00 | 1 |
| 01 | 0 |

The data D is shown in the left column of Table 4 and a program variable PROG_10 is derived for the cells in the right column according to equation (10):

$$PROG\_01 = D\_E + !D\_O \tag{10}$$

The cells in which the data "11," "10," and "00" are to be retained are not to be programmed in step 436, PROG_01 is "1" for those cells, and their drains are coupled to ground. PROG_01 is "0" for the rest of the cells so the voltage VD is coupled to drains of these cells, and a pulse of the programming voltage VG_01 is applied to the control gates of these cells in step 436 to store the data "01."

The programming of the cells in step 436 is verified in step 438 in a manner similar to the verification described with respect to step 412. The reference voltage C is selected to be between H1 and L3, the reference voltage A is selected to be between H3 and L2, and the reference voltage B is selected to be L0. Each of the programmed cells is read to generate read data R. A temporary variable TMP_00 is derived for each programmed cell according to equation (11):

$$TMP\_01 = R\_E + !R\_O \tag{11}$$

TMP_01 is then compared with PROG_01 to generate a variable CMP_01 in equation (12):

$$CMP\_01 = TMP\_01 \; XNOR \; PROG\_01 \tag{12}$$

CMP_01 is equal to "1" when TMP_01 is the same as PROG_01 and the cell is correctly programmed. CMP_01 is equal to "0" when the cell is incorrectly programmed. Overshoot data is not calculated because there is no upper limit for state 0 as shown in FIG. 2.

In step 439 the program counter is incremented and in step 440 the programming is evaluated. If CMP_01 is "1" for all of the programmed cells then the method 400 is done with step 442. If some of the cells were incorrectly programmed the program counter is evaluated in step 444. If the cells have been programmed a maximum number of times the method 400 ends in the failure step 420. If the program counter has not reached a maximum then a new program data variable PROG_01_N is calculated in step 446 according to equation (13):

$$PROG\_01\_N = CMP\_01 \tag{13}$$

The method 400 then returns to step 436 where cells for which PROG_01_N is 0 are programmed with a pulse of the programming voltage VG_01. The method 400 continues with steps 438–440. In an alternate embodiment of the invention the programming voltage VG_01 is increased slightly each time step 436 is repeated.

The methods 300 and 400 described above according to embodiments of the invention programs multi-state flash cells in a precise manner by raising the threshold voltage levels of successively smaller groups of cells in increments. With reference to the method 400 one skilled in the art will recognize that in each programming step the threshold voltage level of the cells being programmed is raised only to the next state. The multi-state flash cells are programmed to store the desired data over several steps. Cells that are under-programmed in any step are reprogrammed before the method continues. Another advantage is that the programming voltages are carefully selected, and the margins 212 shown in FIG. 2 are maintained by a verification of the programmed cells. The methods 300 and 400 therefore provide precise control over the programming of multi-state flash cells. In addition, over-programmed multi-state flash cells are identified and discarded at each programming step by calculating and retaining the overshoot data.

Figure 5:
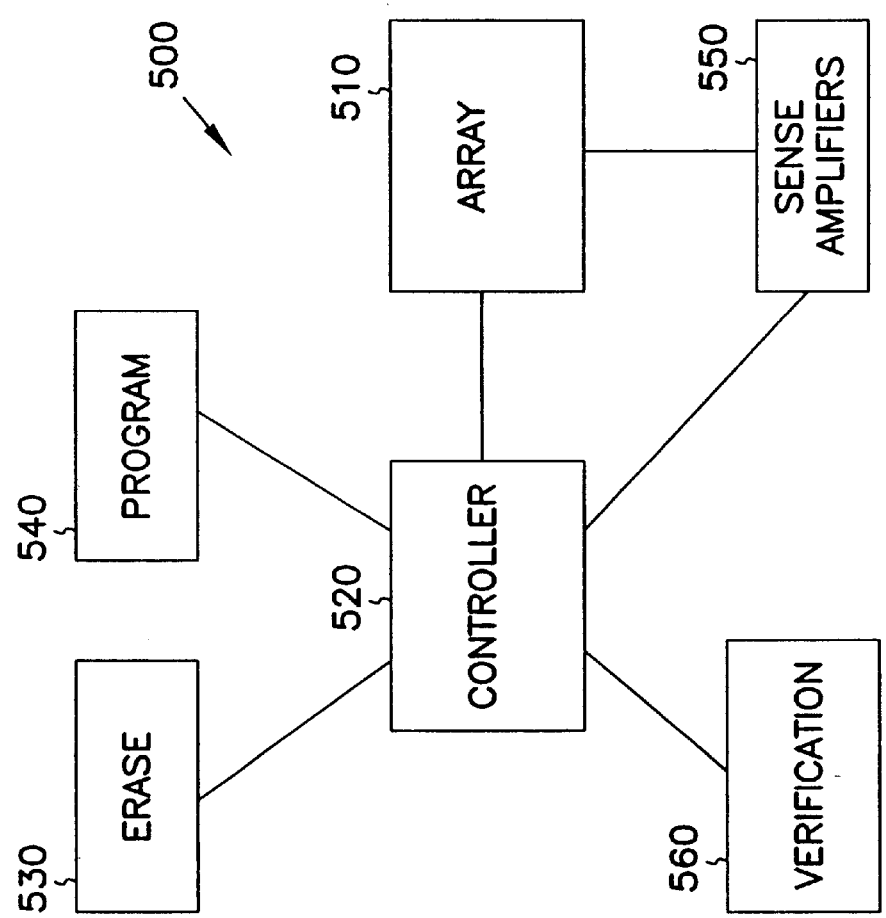
FIG. 5 is a block diagram of a memory system according to another embodiment of the invention.

FIG. 5 is a block diagram of a memory system 500 according to another embodiment of the invention. An array 510 of floating gate transistor memory cells is coupled to a controller 520. An erase circuit 530 and a program circuit 540 are also coupled to the controller 520. A number of sense amplifiers 550 are coupled between the array 510 and the controller 520, and a verification circuit 560 is coupled to the controller 520. The controller 520, the erase circuit 530, the program circuit 540, the verification circuit 560, the array 510 and the sense amplifiers 550 are suitably coupled together by lines allowing instructions and data to pass between these elements. In other embodiments of the invention the elements shown in FIG. 5 are connected in different arrangements. For example, in one embodiment of the invention the erase circuit 530, the program circuit 540, and the verification circuit 560 are coupled between the controller 520 and the array 510. The functions provided for in the embodiments of the invention shown in FIGS. 3, 4A, and 4B are implemented by the controller 520, the erase circuit 530, the program circuit 540, and the verification circuit 560 operating on the array 510 and receiving data from the sense amplifiers 550. For example, the cells in the array 510 are erased by the erase circuit 530 and are programmed by the program circuit 540 at the direction of the controller 520. The programming of the cells is verified by the verification circuit 560. The verification circuit 560 reads the cells through the sense amplifiers 550 and compares data from the sense amplifiers 550 to data intended to be programmed into the cells. The controller 520, the erase circuit 530, the program circuit 540, and the verification circuit 560 are implemented in alternative embodiments of the invention by hardwired logic, a Field Programmable Gate Array (FPGA), a hardwired FPGA, programmable logic, a programmable microcontroller, an Application Specific Integrated Circuit (ASIC), a Read Only Memory (ROM), or a sequencer, or any suitable combination thereof.

Figure 6:
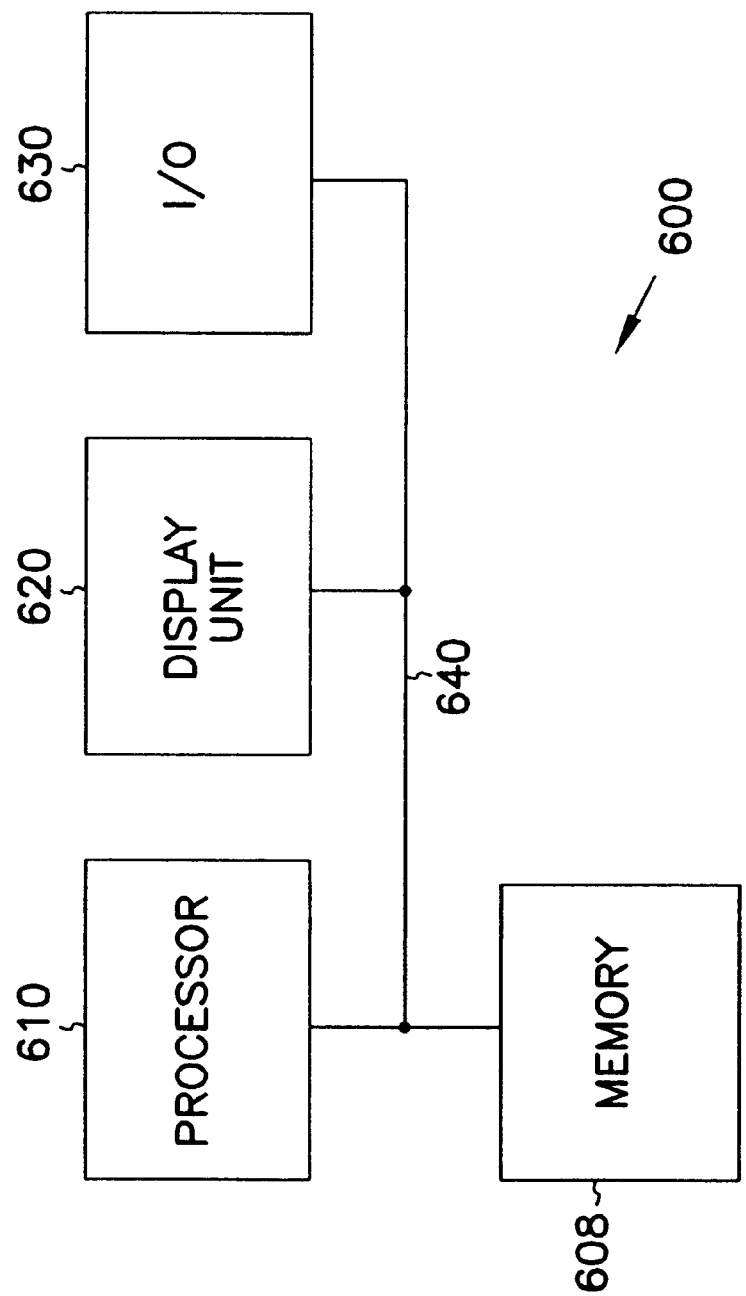
FIG. 6 is a block diagram of an information-handling system according to another embodiment of the present invention.

FIG. 6 is a block diagram of an information-handling system 600 according to an embodiment of the present invention. The information-handling system 600 includes a memory system 608, a processor 610, a display unit 620, and an input/output (I/O) subsystem 630. The memory system 608 is comprised of either the memory system 100 as described in FIG. 1 above, or the memory system 500 as described in FIG. 5 above. The processor 610, the display unit 620, the input/output (I/O) subsystem 630, and the memory system 608 are coupled together by a suitable communication line or bus 640. In various embodiments, the information-handling system 600 is a computer system (such as, for example, a video game, a handheld calculator, a personal computer, or a multiprocessor supercomputer), an information appliance (such as, for example, a cellular telephone, a pager, or a daily planner or organizer), an information component (such as, for example, a magnetic disk drive or telecommunications modem), or other appliance (such as, for example, a hearing aid, washing machine or microwave oven having an electronic controller). In alternate embodiments of the invention, the display unit 620, the I/O subsystem 630, or both include the memory system 100 as described in FIG. 1 above, or the memory system 500 as described in FIG. 5 above.

Some multi-state flash cells are capable of storing eight, sixteen, or even more threshold voltage levels and may therefore store more than two data bits. Those skilled in the art will recognize that the embodiments of the invention described above are applicable to arrangements of multi-state flash cells having more than four threshold voltage levels.

Although the present invention has been described with reference to preferred embodiments, those skilled in the art will recognize that changes may be made in form and detail without departing from the spirit and scope of the invention. The scope of the present invention is defined only by the appended claims and their equivalents.

What is claimed is:

1. A method for programming a plurality of multi-state flash cells in a memory device comprising:

erasing a plurality of multi-state flash cells in a memory device to a first threshold voltage level;

programming each cell in a group of the cells to a second threshold voltage level above the first threshold voltage level;

identifying first overprogrammed cells in the group that have a threshold voltage above the second threshold voltage level;

programming each cell in a first subset of the group of cells to a third threshold voltage level above the second threshold voltage level;

identifying second overprogrammed cells in the first subset that have a threshold voltage above the third threshold voltage level; and programming each cell in a second subset of the cells in the first subset to a fourth threshold voltage level above the third threshold voltage level.

2. The method of claim 1, further comprising:

reading each cell in the group of cells to generate read data and comparing the read data with data corresponding to the second threshold voltage level to verify the programming of the cells in the group;

reading each cell in the first subset to generate read data and comparing the read data with data corresponding to the third threshold voltage level to verify the programming of the cells in the first subset;

reading each cell in the second subset to generate read data and comparing the read data with data corresponding to the fourth threshold voltage level to verify the programming of the cells in the second subset; and wherein identifying first overprogrammed cells comprises, for each cell in the group:

selecting a first reference voltage to be approximately equal to an upper limit of the second threshold voltage level;

applying the first reference voltage to a control gate of the cell; and identifying the cell as overprogrammed if it is not activated to conduct current; and wherein identifying second overprogrammed cells comprises, for each cell in the first subset:

selecting a second reference voltage to be approximately equal to an upper limit of the third threshold voltage level;

applying the second reference voltage to a control gate of the cell; and identifying the cell as overprogrammed if it is not activated to conduct current.

3. A method for programming a plurality of multi-state memory cells in a memory device, the method comprising:

programming each multi-state memory cell in a group of the cells in a memory device to a first state;

identifying first overprogrammed cells in the group that have a state above the first state;

programming each cell in a first subset of the group to a second state above the first state; and identifying second overprogrammed cells in the first subset that have a state above the second state.

4. The method of claim 3, further comprising programming each cell in a second subset of the cells in the first subset to a third state above the second state.

5. The method of claim 3, wherein:
identifying first overprogrammed cells comprises, for each cell in the group:
  selecting a first reference voltage to be approximately equal to an upper limit of a first threshold voltage band comprising the first state;
  applying the first reference voltage to a control gate of the cell; and
  identifying the cell as overprogrammed if it is not activated to conduct current; and
identifying second overprogrammed cells comprises, for each cell in the first subset:
  selecting a second reference voltage to be approximately equal to an upper limit of a second threshold voltage band comprising the second state;
  applying the second reference voltage to a control gate of the cell; and
  identifying the cell as overprogrammed if it is not activated to conduct current.

6. The method of claim 3, further comprising:
verifying that each cell in the group of cells is programmed comprises reading each cell in the group of cells to generate read data and comparing the read data with data corresponding to the first state;
verifying that each cell in the first subset is programmed comprises reading each cell in the first subset to generate read data and comparing the read data with data corresponding to the second state; and
verifying that each cell in the second subset is programmed comprises reading each cell in the second subset to generate read data and comparing the read data with data corresponding to the third state.

7. The method of claim 4, further comprising erasing the cells in the memory device before programming each cell in the group of cells.

8. The method of claim 7 wherein:
erasing the cells comprises erasing multi-state flash cells in the memory device to a first threshold voltage level;
programming each cell in a group of the cells to a first state comprises programming a group of multi-state flash cells to a second threshold voltage level above the first threshold voltage level;
programming each cell in a first subset comprises programming multi-state flash cells in a first subset of the group of cells to a third threshold voltage level above the second threshold voltage level; and
programming each cell in a second subset comprises programming multi-state flash cells in a second subset of the cells in the first subset to a fourth threshold voltage level above the third threshold voltage level.

9. A method for programming a plurality of multi-state flash cells in a memory device comprising:
erasing a plurality of multi-state flash cells in a memory device to a first threshold voltage level to store first data in the cells;
programming second data into each cell in a group of the cells by programming each cell in the group of cells to a second threshold voltage level above the first threshold voltage level;
reading each cell in the group of cells to generate read data and comparing the read data with the second data to verify the programming of the second data;
identifying first overprogrammed cells in the group that have a threshold voltage above the second threshold voltage level;
programming third data into each cell in a first subset of the group of cells by programming the cells in the first subset to a third threshold voltage level above the second threshold voltage level;
reading each cell in the first subset to generate read data and comparing the read data with the third data to verify the programming of the third data;
identifying second overprogrammed cells in the first subset that have a threshold voltage above the third threshold voltage level;
programming fourth data into each cell in a second subset of the cells in the first subset by programming the cells in the second subset to a fourth threshold voltage level above the third threshold voltage level; and
reading each cell in the second subset to generate read data and comparing the read data with the fourth data to verify the programming of the fourth data.

10. A method for programming a plurality of multi-state memory cells in a memory device, the method comprising:
programming each multi-state memory cell in a group of the cells in a memory device to a first state;
verifying that each cell in the group is programmed to the first state and identifying cells in the group that are above the first state;
programming each cell in a first subset of the group of cells to a second state above the first state;
verifying that each cell in the first subset is programmed to the second state and identifying cells in the first subset that are above the second state;
programming each cell in a second subset of the cells in the first subset to a third state, the third state being different from the second state; and
verifying that each cell in the second subset is programmed to the third state.

11. The method of claim 10, wherein:
programming each cell in a group of the cells comprises programming each cell in the group of cells to a first threshold voltage level;
verifying that each cell in the group is programmed comprises reading each cell in the group of cells to generate read data and comparing the read data with data corresponding to the first threshold voltage;
identifying cells in the group comprises, for each cell in the group:
  selecting a first reference voltage to be approximately equal to an upper limit of a first threshold voltage band comprising the first state;
  applying the first reference voltage to a control gate of the cell; and
  identifying the cell as overprogrammed if it is not activated to conduct current;
programming each cell in a first subset comprises programming each cell in the first subset to a second threshold voltage level above the first threshold voltage level;
verifying that each cell in the first subset is programmed comprises reading each cell in the first subset to generate read data and comparing the read data with data corresponding to the second threshold voltage level;
identifying cells in the first subset comprises, for each cell in the first subset:
  selecting a second reference voltage to be approximately equal to an upper limit of a second threshold voltage band comprising the second state;

applying the second reference voltage to a control gate of the cell; and identifying the cell as overprogrammed if it is not activated to conduct current;

programming each cell in a second subset comprises programming each cell in the second subset to a third threshold voltage level above the second threshold voltage level; and verifying that each cell in the second subset is programmed comprises reading each cell in the second subset to generate read data and comparing the read data with data corresponding to the third threshold voltage level.

12. A method for programming a plurality of multi-state cells in a memory device to selected states, the method comprising:

programming each multi-state cell in a group of the cells in a memory device to an initial state;

repeatedly programming each cell in subsets of the group of cells to a subsequent state, each subset of cells comprising cells previously programmed to a lower state; and repeatedly identifying cells in the subsets that have a state above the subsequent state.

13. The method of claim 12 wherein:

programming each cell in a group of the cells comprises erasing a group of multi-state flash cells in the memory device to a first threshold voltage level;

repeatedly programming each cell in subsets of the group of cells comprises repeatedly programming each multi-state flash cell in subsets of the group to a new threshold voltage level higher than a threshold voltage level previously held by the cells in the subset; and repeatedly identifying comprises repeatedly identifying multi-state flash cells in the subsets that have a threshold voltage above an upper limit of the new threshold voltage level.

14. A method for programming a plurality of multi-state flash cells in a memory device comprising:

erasing each of a plurality of multi-state flash cells in a memory device to a first threshold voltage level to store first data in each cell;

programming second data into each cell in a group of the cells by programming each cell in the group to a second threshold voltage level above the first threshold voltage level;

reading each cell in the group to generate read data and comparing the read data with the second data to verify the programming of the second data;

determining the identity of cells in the group having a threshold voltage higher than the second threshold voltage level;

determining the identity of under-programmed cells in the group having a threshold voltage lower than the second threshold voltage level and programming the second data into the under-programmed cells in the group additional times;

programming third data into each cell in a first subset of the group by programming each cell in the first subset to a third threshold voltage level above the second threshold voltage level;

reading each cell in the first subset to generate read data and comparing the read data with the third data to verify the programming of the third data;

determining the identity of cells in the first subset having a threshold voltage higher than the third threshold voltage level;

determining the identity of under-programmed cells in the first subset having a threshold voltage lower than the third threshold voltage level and programming the third data into the under-programmed cells in the first subset additional times;

programming fourth data into a second subset of the first subset by programming each cell in the second subset to a fourth threshold voltage level above the third threshold voltage level;

reading each cell in the second subset to generate read data and comparing the read data with the fourth data to verify the programming of the fourth data; and determining the identity of under-programmed cells in the second subset having a threshold voltage lower than the fourth threshold voltage level and programming the fourth data into the under-programmed cells in the second subset additional times.

15. A memory device, comprising:

a plurality of multi-state cells;

programming circuitry; and a controller such that the controller:

programs each cell in a group of the cells to an initial state;

repeatedly programs each cell in subsets of the group of cells to a subsequent state, each subset of cells comprising cells previously programmed to a lower state; and repeatedly identifies cells in the subsets that have a state above the subsequent state.

16. The memory device of claim 15 wherein:

the cells are arranged in an array having rows and columns of the cells;

when the controller programs each cell in a group of the cells the controller erases a group of multi-state flash cells in the memory device to a first threshold voltage level;

when the controller repeatedly programs each cell in subsets of the group of cells the controller repeatedly programs each multi-state flash cell in subsets of the group to a new threshold voltage level higher than a threshold voltage level previously held by the cells in the subset; and when the controller repeatedly identifies the controller repeatedly identifies multi-state flash cells in the subsets that have a threshold voltage above an upper limit of the new threshold voltage level.

17. A memory device comprising:

a plurality of multi-state flash cells; and control circuitry programmed to:

erase the cells to a first threshold voltage level;

program each cell in a group of the cells to a second threshold voltage level above the first threshold voltage level;

identify first overprogrammed cells in the group that have a threshold voltage above the second threshold voltage level;

program each cell in a first subset of the group of cells to a third threshold voltage level above the second threshold voltage level;

identify second overprogrammed cells in the first subset that have a threshold voltage above the third threshold voltage level; and program each cell in a second subset of the cells in the first subset to a fourth threshold voltage level above the third threshold voltage level.

18. The memory device of claim 17 wherein the control circuitry is further programmed to:
   read each cell in the group of cells to generate first read data and compare the first read data with data corresponding to the second threshold voltage level to verify the programming of the cells in the group;
   read each cell in the first subset to generate second read data and compare the second read data with data corresponding to the third threshold voltage level to verify the programming of the cells in the first subset; and
   read each cell in the second subset to generate third read data and compare the third read data with data corresponding to the fourth threshold voltage level to verify the programming of the cells in the second subset.

19. A memory device comprising:
   a plurality of multi-state memory cells;
   control circuitry; and
   software stored in the memory device and operative on the control circuitry to:
      program each cell in a group of the cells to a first state;
      verify that each cell in the group is programmed to the first state and identify cells in the group that are above the first state;
      program each cell in a first subset of the group of cells to a second state above the first state;
      verify that each cell in the first subset is programmed to the second state and identify cells in the first subset that are above the second state;
      program each cell in a second subset of the cells in the first subset to a third state above the second state; and
      verify that each cell in the second subset is programmed to the third state.

20. The memory device of claim 19, wherein:
   the cells are arranged in an array having rows and columns of the cells;
   program each cell in a group of the cells comprises program each cell in the group of cells to a first threshold voltage level;
   verify that each cell in the group is programmed comprises read each cell in the group of cells to generate first read data and compare the first read data with data corresponding to the first threshold voltage;
   program each cell in a first subset comprises program each cell in the first subset of the group of cells to a second threshold voltage level above the first threshold voltage level;
   verify that each cell in the first subset is programmed comprises read each cell in the first subset to generate second read data and compare the second read data with data corresponding to the second threshold voltage level;
   program each cell in a second subset comprises program each cell in the second subset of the cells in the first subset to a third threshold voltage level above the second threshold voltage level; and
   verify that each cell in the second subset is programmed comprises read each cell in the second subset to generate third read data and compare the third read data with data corresponding to the third threshold voltage level.

21. A memory device comprising:
   a plurality of multi-state memory cells;
   control circuitry; and
   software stored in the memory device and operative on the control circuitry to:
      erase each cell to a first threshold voltage level to store first data in each cell;
      program second data into each cell in a group of the cells by programming each cell in the group to a second threshold voltage level above the first threshold voltage level;
      read each cell in the group to generate read data and compare the read data with the second data to verify the programming of the second data;
      determine the identity of cells in the group having a threshold voltage higher than the second threshold voltage level;
      determine the identity of under-programmed cells in the group having a threshold voltage lower than the second threshold voltage level and program the second data into the under-programmed cells in the group additional times;
      program third data into each cell in a first subset of the group by programming each cell in the first subset to a third threshold voltage level above the second threshold voltage level;
      read each cell in the first subset to generate read data and compare the read data with the third data to verify the programming of the third data;
      determine the identity of cells in the first subset having a threshold voltage higher than the third threshold voltage level;
      determine the identity of under-programmed cells in the first subset having a threshold voltage lower than the third threshold voltage level and program the third data into the under-programmed cells in the first subset additional times;
      program fourth data into a second subset of the first subset by programming each cell in the second subset to a fourth threshold voltage level above the third threshold voltage level;
      read each cell in the second subset to generate read data and compare the read data with the fourth data to verify the programming of the fourth data; and
      determine the identity of under-programmed cells in the second subset having a threshold voltage lower than the fourth threshold voltage level and program the fourth data into the under-programmed cells in the second subset additional times.

22. A memory device comprising:
   a plurality of multi-state memory cells;
   programming circuitry; and
   control circuitry causing the programming circuitry to:
      program each cell in a group of the cells to an initial state;
      repeatedly program each cell in subsets of the group of cells to a subsequent state, each subset of cells comprising cells previously programmed to a lower state; and
      repeatedly identify cells in each subset having a state above the subsequent state.

23. The memory device of claim 22, further comprising:
   erasing circuitry, the control circuitry causing the erasing circuitry to erase the cells in the group to the initial state; and
   verification circuitry, the control circuitry causing the verification circuitry to read data from the cells in the group and to compare the data read to program data to verify that the cells in the group are correctly programmed.

24. A memory device comprising:

a plurality of multi-state memory cells;

control circuitry; and programming circuitry activated by the control circuitry to:
  program each cell in a group of the cells to an initial state;
  repeatedly program each cell in subsets of the group of cells to a subsequent state, each subset of cells comprising cells previously programmed to a lower state; and
  repeatedly identify cells in each subset having a state above the subsequent state.

25. The memory device of claim 24, further comprising:

erasing circuitry activated by the control circuitry to erase the cells in the group to the initial state; and verification circuitry activated by the control circuitry to read data from the cells in the group and to compare the data read to program data to verify that the cells in the group are correctly programmed.

26. A system comprising:

a processor; and a memory device comprising:
  a plurality of multi-state memory cells;
  programming circuitry; and
  control circuitry causing the programming circuitry to:
    program each cell in a group of the cells to an initial state;
    repeatedly program each cell in subsets of the group of cells to a subsequent state, each subset of cells comprising cells previously programmed to a lower state; and
  repeatedly identify cells in each subset having a state above the subsequent state.

27. The system of claim 26, further comprising:

a display unit;

an input/output device;

a bus; and wherein the memory device further comprises:
  erasing circuitry, the control circuitry causing the erasing circuitry to erase the cells in the group to the initial state; and
  verification circuitry, the control circuitry causing the verification circuitry to read data from the cells in the group and to compare the data read to program data to verify that the cells in the group are correctly programmed.

28. A system comprising:

a processor; and a memory device comprising:
  a plurality of multi-state memory cells;
  control circuitry; and
  programming circuitry activated by the control circuitry to:
    program each cell in a group of the cells to an initial state;
    repeatedly program each cell in subsets of the group of cells to a subsequent state, each subset of cells comprising cells previously programmed to a lower state; and
repeatedly identify cells in each subset having a state above the subsequent state.

29. The system of claim 28, further comprising:

a display unit;

an input/output device;

a bus; and wherein the memory device further comprises:
  erasing circuitry activated by the control circuitry to erase the cells in the group to the initial state; and
  verification circuitry activated by the control circuitry to read data from the cells in the group and to compare the data read to program data to verify that the cells in the group are correctly programmed.

30. A memory device, comprising:

a plurality of multi-state cells;

a control circuit; and means for programming each of the cells to one of four states and identifying cells that are over-programmed.

* * * * *

UNITED STATES PATENT AND TRADEMARK OFFICE
CERTIFICATE OF CORRECTION

PATENT NO.    : 6,567,302 B2
DATED         : May 20, 2003
INVENTOR(S)   : Vinod Lakhani It is certified that error appears in the above-identified patent and that said Letters Patent is hereby corrected as shown below:

Column 8,
Line 14, delete "*PROG_10_N=CMP_10+O_tm*" and insert
-- PROG_10_N = CMP_10 + O_D -- therefor.

Signed and Sealed this

Twenty-eighth Day of October, 2003

JAMES E. ROGAN
*Director of the United States Patent and Trademark Office*